United States Patent
Morita et al.

(10) Patent No.: US 7,531,990 B2
(45) Date of Patent: May 12, 2009

(54) VOLTAGE DETECTOR FOR AN ASSEMBLED BATTERY

(75) Inventors: Tsuyoshi Morita, Zama (JP); Utaka Kamishima, Kawasaki (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 320 days.

(21) Appl. No.: 11/493,472

(22) Filed: Jul. 26, 2006

(65) Prior Publication Data

US 2007/0024240 A1    Feb. 1, 2007

(30) Foreign Application Priority Data

Jul. 28, 2005    (JP)    ............... 2005-219000

(51) Int. Cl.
*H02J 7/06* (2006.01)
*G01N 27/02* (2006.01)

(52) U.S. Cl. .................. 320/164; 320/120; 320/118; 324/433

(58) Field of Classification Search ............. 320/120, 320/118, 164; 324/433, 522
See application file for complete search history.

(56) References Cited

U.S. PATENT DOCUMENTS 5,644,212 A * 7/1997 Takahashi .................. 320/134
5,652,501 A * 7/1997 McClure et al. ........ 340/636.15

FOREIGN PATENT DOCUMENTS

| JP | 05-0249128 | 9/1993 |
|---|---|---|
| JP | 2004-056978 | 2/2004 |
| JP | 2004-325263 | 11/2004 |

* cited by examiner

*Primary Examiner*—Adolf Berhane
*Assistant Examiner*—Yalkew Fantu
(74) *Attorney, Agent, or Firm*—Young Basile

(57) ABSTRACT

An apparatus and method for detecting total voltage of an assembled battery including a number of serially-connected electric cells. Voltages of the respective cells are detected and added up, correlation between the resulting total voltage and a total voltage obtained by detecting the voltage of the assembled battery directly from its terminals is obtained, and a corrective arithmetic operation is carried out inside the device to correct the total voltage obtained through direct detection. The total voltage is detected with a high degree of accuracy without the need for individual adjustment operations using a variable resistance, high-accuracy external tester.

20 Claims, 5 Drawing Sheets

VOLTAGE DETECTOR FOR AN ASSEMBLED BATTERY

CROSS-REFERENCE TO RELATED APPLICATION

This application claims priority from Japanese Patent Application Serial No. 2005-219000, filed Jul. 28, 2005, the entire contents of which is incorporated herein by reference.

TECHNICAL FIELD

The present invention pertains to a voltage detector that is used to detect the voltage of an assembled battery.

BACKGROUND

As described in Kokai Patent Application No. 2004-56978 and Kokai Patent Application No. 2004-325263, a voltage sensor (or a voltage detector) used to detect the voltage of an assembled battery in which multiple electric cells are electrically connected in series is known. This kind of voltage sensor must be able to detect the total voltage, which is a higher voltage generated by connecting multiple cells in series. This voltage sensor is thus used to detect a wide range of voltage values, and error becomes more significant as a result. Thus, an error correction operation is usually needed in which the total voltage is detected using a high-accuracy tester at the time of shipment, a detection error of the voltage sensor was measured based on this highly-accurate, detected total voltage, and the error for each unit is corrected using a variable resistor. This error correction operation is time-consuming.

BRIEF SUMMARY OF THE INVENTION

According to one aspect the invention, a total voltage detector is provided for an assembled battery in which multiple electric cells are electrically connected in series. The detector includes, by example, cell voltage sensors that detect voltages of the multiple cells, a total voltage sensor that detects a first total voltage of the assembled battery by detecting the voltage between the positive and negative terminals of the assembled battery and a controller receiving input from the cell voltage sensors and the total voltage sensor. The controller includes a total voltage computation part operable to compute a second total voltage of the assembled battery by adding together the voltages of the multiple cells, a correlation determination part operable to obtain a correlation between the second total voltage and the first total voltage and a total voltage correction part operable to correct the first total voltage based on the correlation.

In some embodiments, the total voltage detector includes means for detecting voltages of the multiple cells, means for detecting a first total voltage of the assembled battery by detecting a voltage between positive and negative terminals of the assembled battery, means for computing a sum of the voltages of the multiple cells, means for determining a correlation between the sum and the first total voltage and means for correcting the first total voltage based on the correlation.

In accordance with yet another aspect of the invention, a method of detecting a total voltage of an assembled battery in which multiple electric cells are electrically connected in series is provided. The method comprises, for example, detecting voltages of the multiple cells, detecting a first total voltage of the assembled battery by detecting the voltage between positive and negative terminals of the assembled battery, adding together the voltages of the multiple cells to obtain a second total voltage of the assembled battery, obtaining a correlation between the second total voltage and the first total voltage and selectively correcting the first total voltage based on the correlation.

BRIEF DESCRIPTION OF THE DRAWINGS

The description herein makes reference to the accompanying drawings wherein like reference numerals refer to like parts throughout the several views, and wherein.

DETAILED DESCRIPTION OF EMBODIMENTS OF THE INVENTION

Embodiments of the invention eliminate the need for the known error correction operation while still obtaining an accurate measure of total battery voltage. Error in the total voltage of the assembled battery is corrected automatically without relying on any external tester. Embodiments of the apparatus and method of the invention are explained below using FIGS. 1-7.

Figure 1:
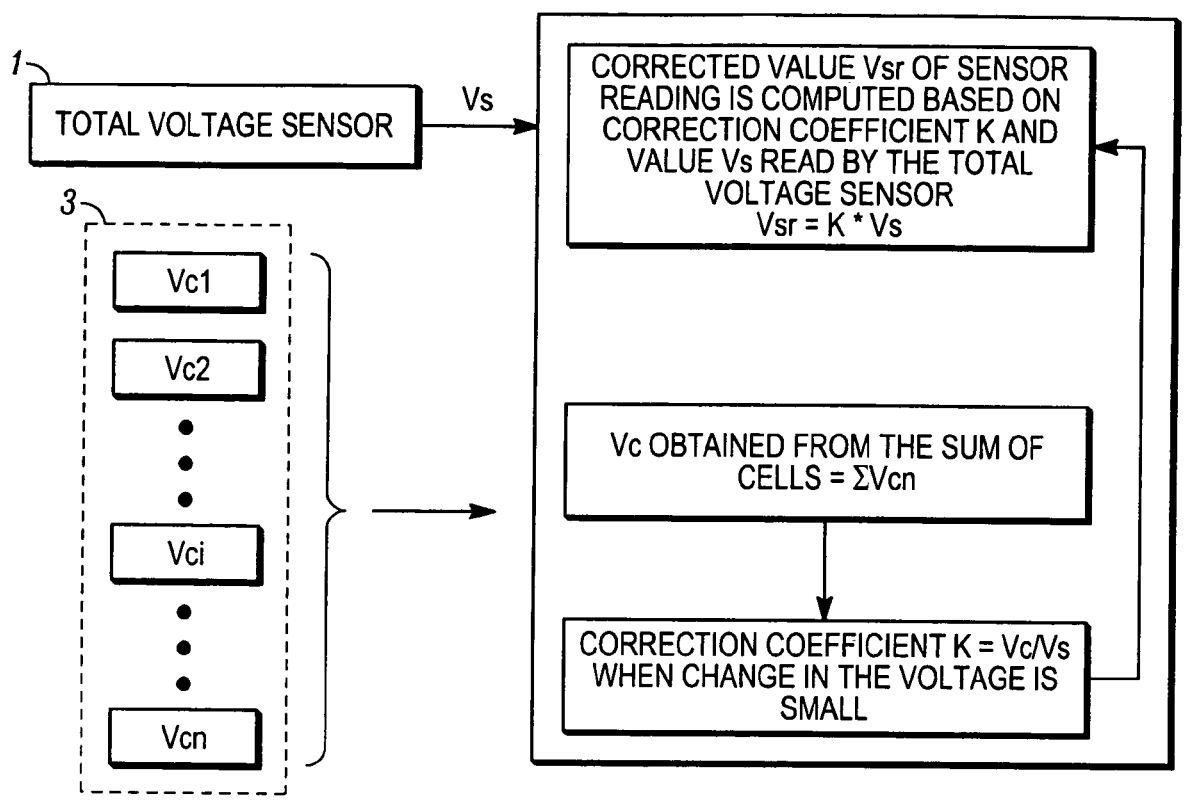
FIG. 1 is a block diagram showing the basic procedure for detecting the total voltage of an assembled battery in accordance with embodiments of the invention.

FIG. 1 illustrates a basic procedure for measurement of the total voltage of the assembled battery according to embodiments of the invention. In FIG. 1, voltages Vc1 through Vcn of n constituent cell units of the assembled battery are measured individually, and total Vc of the voltages measured for the n cell units is obtained. Next, total voltage sensor 1 is used to measure total voltage Vs of the assembled battery. The correlation between Vc and Vs is computed as correction coefficient K at a prescribed time at which the charging/discharging current of the assembled battery becomes equal to or lower than a prescribed value during system startup, that is, when the voltage of the assembled battery changes little. This correlation is based on values Vc and Vs according to the following:

$$K = Vc/Vs \qquad (1)$$

Total voltage Vsr (corrected for measurement error) of the assembled battery after the correction is made using correction coefficient K is computed as follows:

$$Vsr = K*Vs \qquad (2)$$

Figure 2:
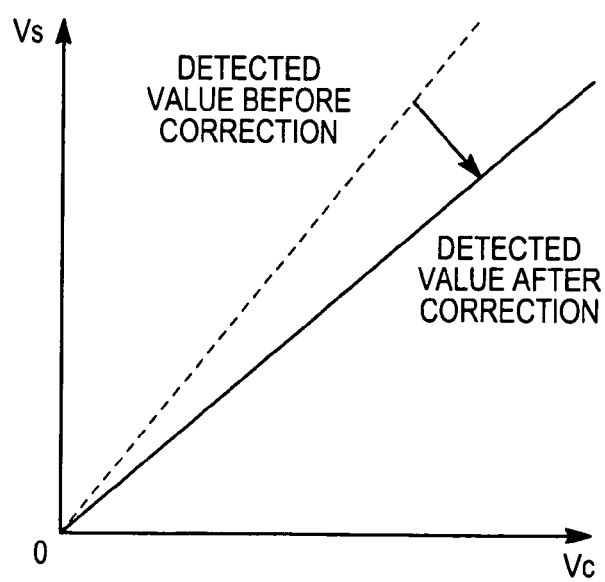
FIG. 2 is a graph for explaining the principles of total voltage measurement error correction.

FIG. 2 graphically illustrates the correction where the abscissa axis indicates total Vc of the individual cell voltages, and the ordinate axis indicates the total voltage Vs of the assembled battery corresponding to the number of cells. The broken line indicates the output of total voltage sensor 1 as the value actually measured prior to correction, and the solid line indicates the total voltage after the correction is made.

When the apparatus according to FIG. 1 is used cumbersome gain adjustments are no longer needed, and the total voltage of the assembled battery can be measured quickly with little error. This is because correction coefficient K, as the correlation between Vc and Vs when the battery voltage shows little change at the time of startup, or while the charging/discharging current of the assembled battery is regulated to be equal to or lower than a prescribed value, is obtained in advance, and microcomputer of battery controller 4 multiplies total voltage Vs of the assembled battery detected by total voltage sensor 1 by correction coefficient K to correct the total voltage of the assembled battery automatically.

Figure 3:
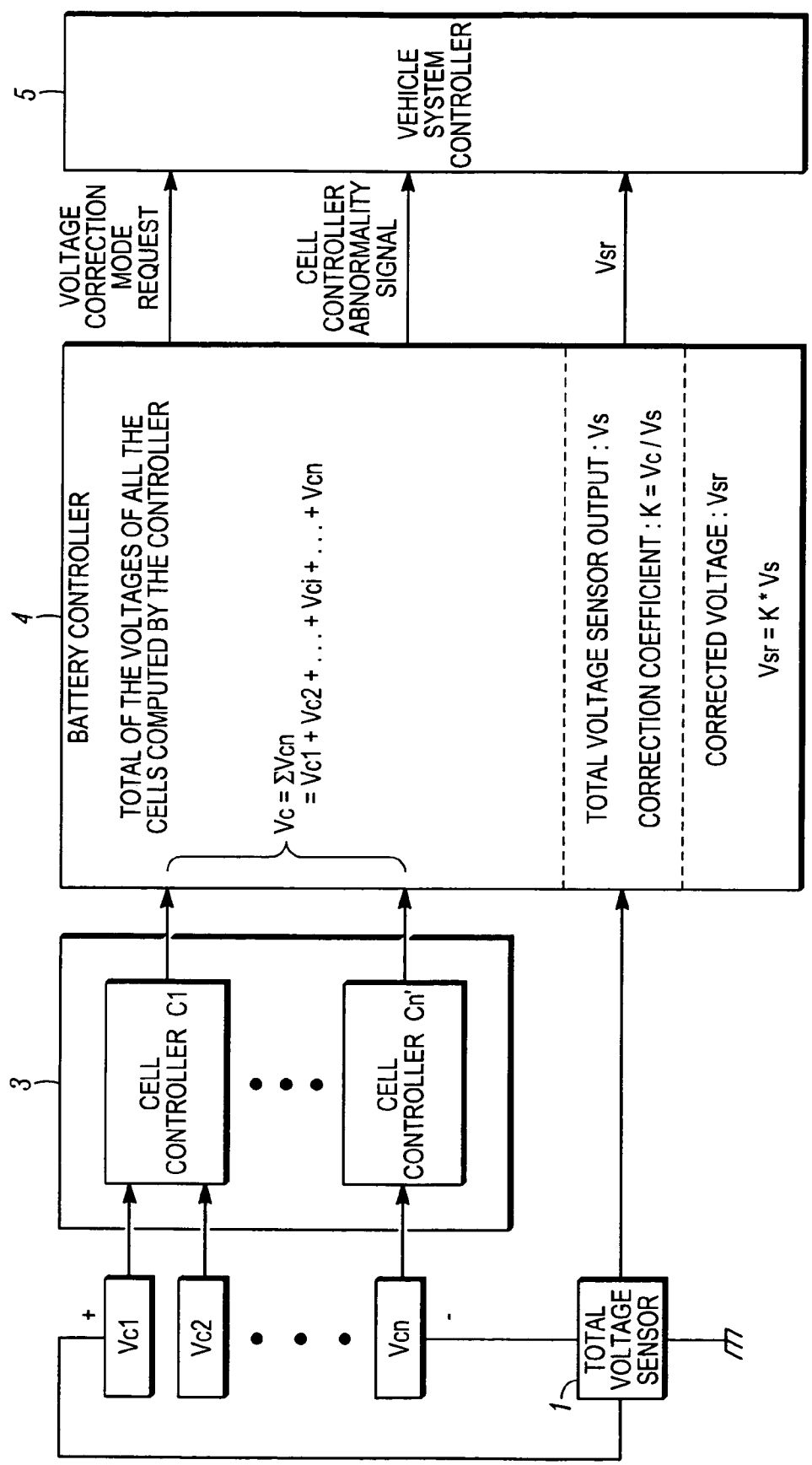
FIG. 3 is a diagram showing one configuration of an assembled battery voltage detector.

A block diagram of one embodiment of an assembled battery voltage detector that uses the total voltage sensor shown in FIG. 1 for the correction is shown in FIG. 3. In FIG. 3, n cell units with output voltages of Vc1 through Vcn are connected to cell controllers C1 through Cn', respectively. (The respective cell controllers will be shown as C1 through Cn', and cell controllers C1 through Cn' will be collectively referred to as controller 3 hereinafter.) Cell controllers C1 through Cn' are connected either to each of the respective cells or to blocks created by dividing the total number n of cells into blocks, each comprising k cell units. For example, where k=2, n'=n/k=n/2. The respective cell controllers C1 through Cn' detect the voltages of the respective cells to which they are connected. In other words, controller 3 is used to detect voltages Vc1 through Vcn of the respective constituent cells of the assembled battery, the voltages of the respective cells detected by cell controller 3 are output to battery controller 4, and the total voltage Vc of cell voltages Vc1 through Vcn is computed by battery controller 4. Total voltage sensor 1 is a sensor used to detect the total voltage of the assembled battery, and it outputs the total voltage it has detected to battery controller 4. As shown here, a single total voltage sensor 1 is provided for a single assembled battery.

Battery controller 4 performs arithmetic processing using a microprocessor or the like, and can be a microcomputer or microcontroller incorporating memory for storing the programming described hereinafter. Battery controller 4 incorporates terminals for input and output of variables. Battery controller 4, for example, receives output Vs from total voltage sensor 1, and the correlation between Vs and total voltage Vc as described above is computed using Equation (1) to obtain correction coefficient K. Furthermore, a post-correction voltage value obtained using correction coefficient K, that is, a more accurate total voltage Vsr of the assembled battery that will be read by vehicle system controller 5, is obtained using Equation (2).

The timing for correction of the value Vs detected by total voltage sensor 1 was described above. In another embodiment 2, however, battery controller 4 corrects the voltage detected by the total voltage sensor either when the charging/discharging current of the assembled battery is low or when a condition in which the voltage changes little is detected, or by creating a condition in which the charging/discharging current of the assembled battery becomes lower than a prescribed value periodically. The condition in which the charging/discharging current of the assembled battery is low (or the condition in which the voltage changes little) applies to the period during startup processing after a vehicle is powered on or while idling at a stop light or while parked, for example. That is, when correction of the voltage detected by total voltage sensor 1 is carried out multiple times at arbitrary timing while the system is running, or by carrying it out periodically multiple times, even in the event of a change in gain due to temperature drift of total voltage sensor 1, correction can be applied constantly to correct a gain error intrinsic to the total voltage sensor itself, and a gain error can also be corrected in the event of an error attributable to an environmental factor such as temperature drift of the total voltage sensor.

Figure 4:
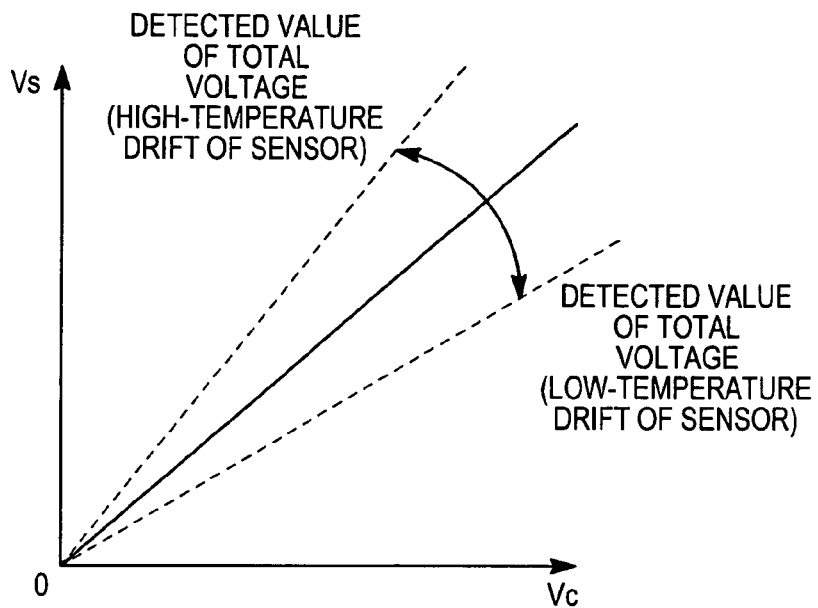
FIG. 4 is a graph for explaining the principles of temperature drift correction by means of a total voltage sensor.

FIG. 4 shows how the gain of total voltage sensor 1 changes due to temperature drift of total voltage sensor 1. Changes in the gain are shown when the temperature of total voltage sensor 1 is high and when it is low. In either case, the gain is corrected to match the value indicated by the solid line shown in FIG. 4. That is, as in FIG. 2, the gain is corrected based on the correlation between the total voltage of all the cells and the voltage detected by total voltage sensor 1. As such, a detection error of total voltage sensor 1 due to an environmental change such as temperature drift is also corrected automatically.

However, if the voltage detected by total voltage sensor 1 is corrected at arbitrary times or periodically, for example, when the assembled battery is putting out a high discharge current or when it is taking in a charging current, the voltage detected by total voltage sensor 1 changes while it is detecting the voltages of the respective cells (during time T during which voltages are obtained from the respective cells), so that accurate correlation cannot be obtained between the total voltage of all the cells and the voltage detected by total voltage sensor 1. Therefore, as described above, the correlation between the total voltage of all the cells and the voltage detected by total voltage sensor 1 is obtained either when the change in total voltage of the assembled battery is small or when a condition in which the discharging current of the battery is low, or by creating a condition in which the charging/discharging current of the assembled battery is lower.

Figure 5:
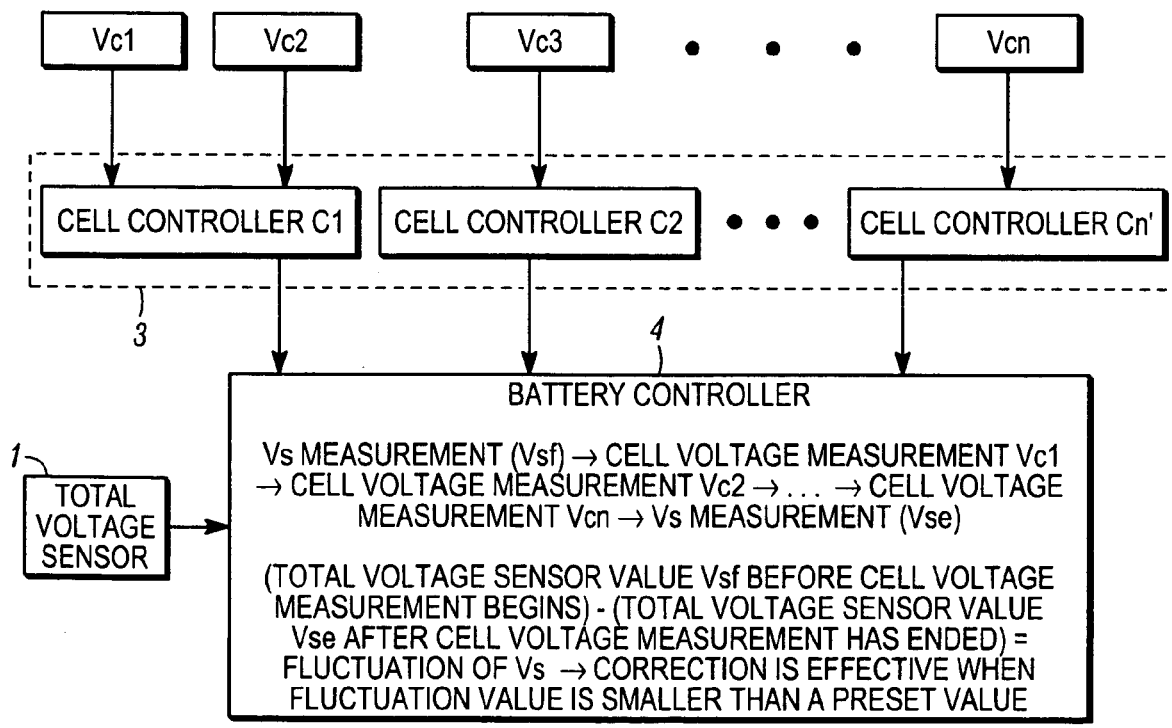
FIG. 5 is a block diagram showing the principles of a temperature drift correction part in the total voltage sensor.

FIG. 5 shows such a procedure. The voltages of respective cells Vc1 through Vcn are measured in sequence via cell controller 3 that includes the cell voltage measurement system, and the total voltages of the assembled battery before and after this series of measurements, that is, the total voltage Vsf of the assembled battery immediately before measurements of the cell voltages begin and total voltage Vse of the assembled battery immediately after that, are measured by total voltage sensor 1. The difference between the measured values can be obtained using the equation below:

$$Vsf - Vse = \neq Vs \qquad (3)$$

Here, ΔVs indicates the change in total voltage while the voltages of all the cells are being detected (that is, the change in total voltage over time T during which the voltages of all the cells are detected). If the change is smaller than a prescribed value, the correction processing can be carried out effectively. Conversely, if the change is greater than the prescribed value the correction coefficient K used previously is used.

As described above, even in the event of temperature drift in the total voltage sensor an output error attributable to the temperature drift can be reduced through gain correction without requiring temperature detection. Hence, the total voltage of the assembled battery can be measured with a high degree of accuracy at all times.

In another embodiment, the operations of cell controller 3 are monitored by battery controller 4. When battery controller 4 determines that cell controller 3 has become defective, the operation for correcting the total voltage detected by total voltage sensor 1 is stopped automatically. Then, the value detected by total voltage sensor 1 is used as a recognized voltage as is by the battery controller provided in the microcomputer, so that the operation can be continued even in the event of a defect in cell controller 3. In this case, a temporary action is taken to not compute correction coefficient K, and output Vs of total voltage sensor 1 is used as is.

Figure 6:
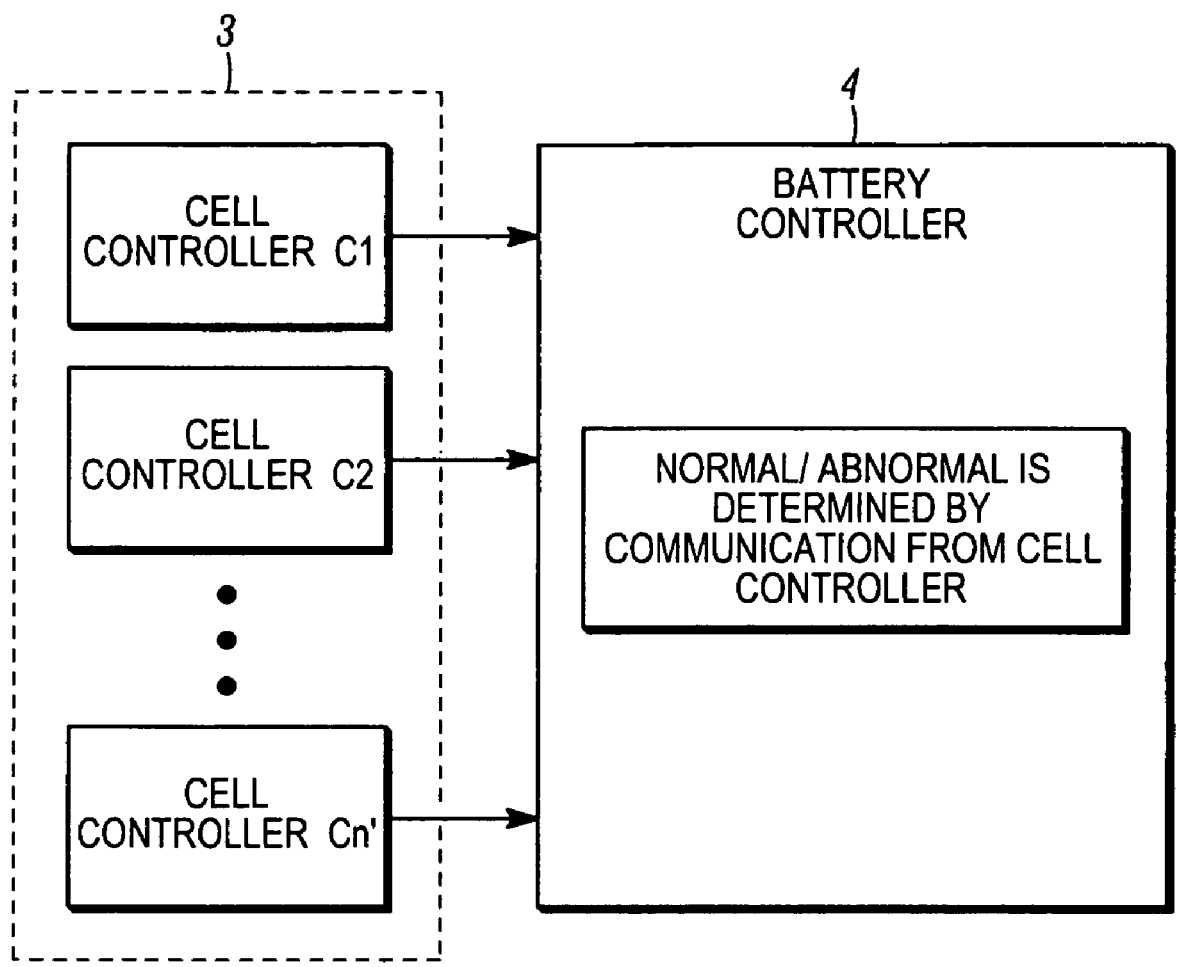
FIG. 6 is a block diagram showing the principles of a cell controller fault detection method.

The defect detection of cell controller 3 is illustrated by FIG. 6. The defect in cell controller 3 as referred to herein relates to a case in which any one of cell controllers C1 through Cn' has become defective. In FIG. 6, each of cell controllers C1 through Cn' is equipped with a self-diagnostic function by means of which the controller itself determines that it has become defective when the cell voltage it detects falls into a voltage value range too high or too low to occur under normal conditions. Each cell controller C1 to Cn' transmits a defect signal when it determines that it has become defective regardless of the type of defect, or transmits a normal signal that indicates it is operating normally if it is not defective (if it is normal), to battery controller 4. Battery controller 4 determines whether cell controller 3 is normal or abnormal upon receiving the signals from the respective cell controllers C1 through Cn'. When a judgment results that any of cell controllers C1 through Cn' is defective, although the read error of the voltage sensor is intensified, the operation can still be continued using the output Vs of total voltage sensor 1.

The defect detection of cell controller 3 is not restricted to this method. For example, when battery controller 4 cannot communicate with any of cell controllers C1 through Cn', that is, when battery controller 4 can receive neither the defect signal nor the normal signal, it can determine that there is an abnormality.

Figure 7:
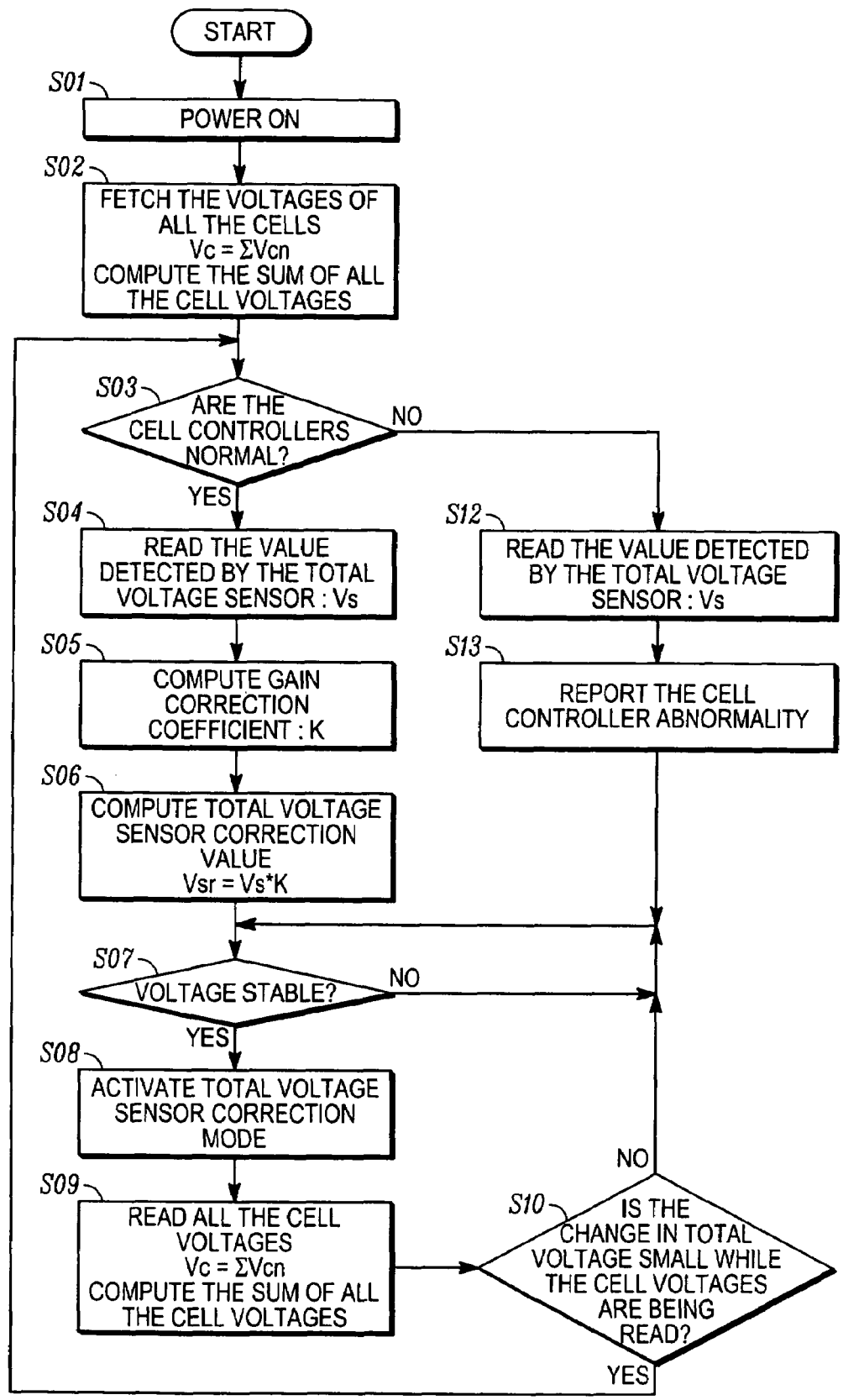
FIG. 7 is a flowchart for one embodiment of assembled battery total voltage correction processing.

A flowchart for the total voltage correction processing described above is shown in FIG. 7. In FIG. 7, after the system is powered on in step S01, the voltages Vc1-Vcn of all the cells are read to obtain a total Vc of the voltage values Vc1 through Vcn in step S02. Next, whether a respective cell controller 3 is normal or not is determined in step S03. If all the cell controllers C1 through Cn' are normal (that is, the response to the query in step S03 is yes), the total voltage Vs of the entire assembled battery is read in step S04, and gain correction coefficient K is computed according to Equation (1) and the gain correction coefficient K stored in a memory is overwritten in step S05. Post-correction total voltage value Vsr of the assembled battery is next computed in step S06 according to Equation (2) using the resulting gain correction coefficient K.

Upon completing these arithmetic operations, in step S07 whether the voltage of the assembled battery is stable or not, that is, whether the change in voltage of the assembled battery is smaller than a prescribed value or not, is determined before entering a standby status for the total voltage sensor correction mode. With regard to the stability of the voltage of the assembled battery, it is determined not to be stable if the voltage change within a prescribed amount of time is greater than a preset voltage range, while it is determined to be stable if it is within said voltage range. Once the voltage is stable, as indicated by step S07, a transition is made to total voltage sensor correction mode in step S08. In the total voltage sensor correction mode, the output of the total voltage sensor is multiplied by the sensor correction coefficient to again obtain post-correction total voltage Vsr for verification. Then the total voltage of all the cells (denoted as Vsf and obtained through the same processing as in step S02) is obtained again, and the result is denoted as Vse in step S09. The difference between total voltage values Vsf and Vse is obtained in order to determine whether the change in total voltage before and after the processing sequence (during the time in which the voltages of all the cells are detected) has exceeded a prescribed value or not in step S10. The process returns to step S03 if the change in total voltage is found to be smaller than the prescribed value (i.e., when the response to the query in step S10 is yes), or the process returns to step S07 if the change in total voltage has exceeded the prescribed value (i.e., when the response to the query in step S10 is no) in order to recalculate the total voltage using total voltage sensor correction coefficient K.

The judgment as to whether the change in total voltage of the assembled battery has exceeded the prescribed value or not in step S10 can be made based on the change in voltage detected by total voltage sensor 1 as described, or it can be determined by detecting the current consumed during the time in which the voltages of all the cells are detected, using a current sensor coupled across the battery terminals in a like manner as the total voltage sensor 1. The current consumed can be the absolute value of the charging/discharging current or the numerical integration value over time.

When cell controller 3 exhibits an abnormality as indicated in step S03 (i.e., when the response to the query in step S03 is no), the total voltage Vs of the assembled battery is read without carrying out the sensor correction arithmetic operation, and the data is transmitted as corrected voltage Vsr to vehicle system controller 5 in step S12. In step S13, the occurrence of an abnormality in cell controller 3 is reported to the vehicle system, and the process advances to step S07.

As shown in FIG. 7, steps S01-S06 correspond to the processing for correcting the value detected by the total voltage sensor at the time of the activation of the system, and steps S07-S10 and steps S03-S06 correspond to the processing for correcting the value detected by the total voltage sensor while the system is running. That is, activation of the system corresponds to the period during which initialization processing of a variety of programs and self-diagnosis of cell controller 3 are carried out. Because the current consumption of the assembled battery is small during this period, change in the total voltage of the assembled battery is small. Hence, processing steps for correcting the value detected by the total voltage sensor, that is, steps S01-S06, are carried out during this period.

In addition, the current consumption changes according to the load operating conditions while the system is running. One such set of conditions results from, for example, the electrical load of a vehicle drive motor that is driven by power from the assembled battery. Because the change in total voltage of the assembled battery fluctuates according to the load operating conditions, the amount of change in the total voltage during the period in which the voltages of the respective cells are detected is determined in Step S10, whereby the processing in steps S03-S06 for correcting the value detected by the total voltage sensor are carried out when the amount of change in the total voltage is smaller than the prescribed value.

In either case, however, the value detected by the total voltage sensor cannot be corrected properly if cell controller 3 contains an abnormality. Thus, when an abnormality in cell controller 3 is detected in step S03, the processing in steps S12 and S13 is carried out instead of correction of the value detected by the total voltage sensor, the value detected by the total voltage sensor is output to vehicle system controller 5 as is, and the abnormality in cell controller 3 is reported as well.

Although total voltage Vs is corrected based on the ratio between total voltage Vc of all the cells and total voltage Vs measured by total voltage sensor 1 in the described embodiments, these impose no restrictions. For example, assembled battery total voltage Vs can be corrected by detecting the difference between total voltage Vc of the cells and total voltage Vs of the assembled battery and adding the difference to total voltage Vs of the assembled battery. In this case, total voltage Vs of the assembled battery is still corrected based on the correlation between total voltage Vc of the cells and total voltage Vs of the assembled battery. However, because the degree of an error attributable to a change in gain changes according to the voltage value, the correction based on the difference between total voltage Vc of the cells and total voltage Vs of the assembled battery can be applied when the range of voltage values to be detected is relatively small or when correction timing is frequent. Correction based on the ratio between total voltage Vc of the cells and total voltage Vs of the assembled battery as originally described detects the value accurately independently of the range of detected voltage values and the frequency of the correction timing.

Also, the above-described embodiments have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A total voltage detector for an assembled battery in which multiple electric cells are electrically connected in series, the detector comprising:
    cell voltage sensors that detect voltages of the multiple cells;
    a total voltage sensor that detects a first total voltage of the assembled battery by detecting the voltage between positive and negative terminals of the assembled battery; and
    a controller receiving input from the cell voltage sensors and the total voltage sensor, the controller including:
        a total voltage computation part operable to compute a second total voltage of the assembled battery by adding together the voltages of the multiple cells;
        a correlation determination part operable to obtain a correlation between the second total voltage and the first total voltage; and
        a total voltage correction part operable to correct the first total voltage based on the correlation.

2. The total voltage detector according to claim 1 wherein the correlation is a ratio between the second total voltage and the first total voltage; and wherein the total voltage correction part is further operable to multiply the first total voltage by the ratio to correct the first total voltage.

3. The total voltage detector according to claim 2 wherein the total voltage correction part is further operable to correct the first total voltage when a change in the first total voltage measured prior to detection of the voltages by the cell voltage sensors and the first total voltage measured after detection of the voltages by the cell voltage sensors is below a predetermined value.

4. The total voltage detector according to claim 1 wherein the total voltage correction part is further operable to correct the first total voltage when a change in the first total voltage measured prior to detection of the voltages by the cell voltage sensors and the first total voltage measured after detection of the voltages by the cell voltage sensors is below a predetermined value.

5. The total voltage detector according to claim 4 wherein a period during which the change is below the predetermined value corresponds to a period immediately after power is provided to the voltage detector.

6. The total voltage detector according to claim 4 wherein a period during which change is below the predetermined value corresponds to a period during which a current through the assembled battery is below a prescribed current value.

7. The total voltage detector according to claim 1, further comprising:
    an abnormality detection part that detects whether respective ones of the cell voltage sensors contain an abnormality; and wherein the total voltage correction part is further operable to select a previously corrected first total voltage as the corrected first total voltage when the abnormality is detected.

8. The total voltage detector according to claim 1 wherein the cell voltage sensors further comprise a respective voltage sensor that detects a voltage of each of the respective multiple cells or at least two voltage sensors, each of which detects a voltage of at least two serially-connected ones of the multiple cells.

9. A total voltage detector for an assembled battery in which multiple electric cells are arranged in series electrically, the detector comprising:
    means for detecting voltages of the multiple cells;
    means for detecting a first total voltage of the assembled battery by detecting a voltage between positive and negative terminals of the assembled battery;
    means for computing a sum of the voltages of the multiple cells;
    means for determining a correlation between the sum and the first total voltage; and
    means for correcting the first total voltage based on the correlation.

10. The total voltage detector according to claim 9, further comprising:
    means for detecting an existence of an abnormality in respective ones of the cell voltage sensors.

11. A method of detecting a total voltage of an assembled battery in which multiple electric cells are electrically connected in series, the assembled battery having positive and negative terminals, the method comprising:
    detecting voltages of the multiple cells;
    detecting a first total voltage of the assembled battery by detecting the voltage between the positive and negative terminals of the assembled battery;
    adding together the voltages of the multiple cells to obtain a second total voltage of the assembled battery;
    obtaining a correlation between the second total voltage and the first total voltage; and
    selectively correcting the first total voltage based on the correlation.

12. The method according to claim 11 wherein obtaining a correlation between the second total voltage and the first total voltage further comprises calculating a ratio between the second total voltage and the first total voltage wherein the ratio is the correlation; and wherein selectively correcting the first total voltage based on the correlation further comprises multiplying the first total voltage by the ratio to correct the first total voltage.

13. The total voltage detector according to claim 12 wherein detecting a first total voltage of the assembled battery further comprises detecting an initial first total voltage of the assembled battery prior to detecting the voltages of the multiple cells and detecting a final first total voltage of the assembled battery after detecting the voltages of the multiple cells; and wherein selectively correcting the first total voltage based on the correlation further comprises correcting the final first total voltage when a difference in the initial first total voltage and the final first total voltage is below a predetermined value.

14. The method according to claim 11 wherein detecting a first total voltage of the assembled battery further comprises detecting an initial first total voltage of the assembled battery prior to detecting the voltages of the multiple cells and detecting a final first total voltage of the assembled battery after detecting the voltages of the multiple cells; and wherein selectively correcting the first total voltage based on the correlation further comprises correcting the final first total voltage when a difference in the initial first total voltage and the final first total voltage is below a predetermined value.

15. The method according to claim 11, further comprising:
detecting an existence of an abnormality in respective ones of the cell voltage sensors.

16. The method according to claim 15 wherein selectively correcting the first total voltage based on the correlation further comprises correcting the first total voltage when the existence of the abnormality is not detected in any one of the cell voltage sensors.

17. The method according to claim 11 wherein detecting voltages of the multiple cells further comprises detecting a respective voltage of each of the multiple cells.

18. The method according to claim 11 wherein detecting voltages of the multiple cells further comprises detecting a respective voltage of at least two serially-connected ones of the multiple cells.

19. The method according to claim 11 wherein obtaining a correlation between the second total voltage and the first total voltage further comprises obtaining a difference between the second total voltage and the first total voltage; and wherein selectively correcting the first total voltage based on the correlation further comprises adding the difference to the first total voltage to obtain a corrected first total voltage.

20. The method according to claim 11, further comprising:
measuring a first current through the assembled battery prior to detecting the voltages of the multiple cells; and
measuring a second current through the assembled battery after detecting the voltages of the multiple cells; and wherein selectively correcting the first total voltage based on the correlation further comprises correcting the first total voltage when a difference in the first current and the second current is below a predetermined value.

* * * * *